(12) United States Patent
Hamazaki et al.

(10) Patent No.: US 9,524,949 B2
(45) Date of Patent: *Dec. 20, 2016

(54) SEMICONDUCTOR DEVICE HAVING SEMICONDUCTOR CHIP AFFIXED TO SUBSTRATE VIA INSULATING RESIN ADHESIVE FILM

(71) Applicant: Dexerials Corporation, Shinagawa-ku, Tokyo (JP)

(72) Inventors: Kazunori Hamazaki, Tochigi (JP); Takashi Matsumura, Tochigi (JP); Daisuke Sato, Tochigi (JP); Yasuhiro Suga, Tochigi (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/155,228

(22) Filed: May 16, 2016

(65) Prior Publication Data

US 2016/0260683 A1    Sep. 8, 2016

Related U.S. Application Data

(62) Division of application No. 13/131,427, filed as application No. PCT/JP2010/052772 on Feb. 23, 2010, now Pat. No. 9,368,374.

(30) Foreign Application Priority Data

Feb. 27, 2009 (JP) .................... 2009-045164

(51) Int. Cl.
| | |
|---|---|
| *H01L 21/00* | (2006.01) |
| *H01L 23/00* | (2006.01) |
| *H01L 21/56* | (2006.01) |

(52) U.S. Cl.
CPC ............. *H01L 24/92* (2013.01); *H01L 21/563* (2013.01); *H01L 24/11* (2013.01); *H01L 24/13* (2013.01);
(Continued)

(58) Field of Classification Search
None
See application file for complete search history.

(56) References Cited

U.S. PATENT DOCUMENTS

| | | |
|---|---|---|
| 5,773,896 A | 6/1998 | Fujimoto et al. |
| 5,864,178 A | 1/1999 | Yamada et al. |

(Continued)

FOREIGN PATENT DOCUMENTS

| | | |
|---|---|---|
| CN | 1339174 A | 3/2002 |
| CN | 1674280 A | 9/2005 |

(Continued)

OTHER PUBLICATIONS

Apr. 20, 2010, International Search issued in Application No. PCT/JP2010/052772 (with English Translation).

(Continued)

*Primary Examiner* — Reema Patel
(74) *Attorney, Agent, or Firm* — Kenja IP Law PC

(57) ABSTRACT

A semiconductor device includes a semiconductor chip provided with a plurality of bumps arranged in a peripheral alignment, a substrate provided with a plurality of electrodes, and an insulating resin adhesive film. The semiconductor chip is affixed to the substrate via the insulating resin adhesive film such that the electrodes are in positions corresponding to the positions of the bumps. The insulating resin adhesive film has a minimum melt viscosity of $8 \times 10^3$ to $1 \times 10^5$ Pa·s, covers 70 to 90% the area of the region enclosed with the plurality of bumps, and heat cured. The bumps and the electrodes corresponding thereto are arranged (Continued)

so that they are opposed to each other and establish metallic contact therebetween. A periphery of the insulating resin adhesive film is defined between the plurality of bumps and the outer edge of the semiconductor chip, exclusive.

5 Claims, 3 Drawing Sheets

(52) U.S. Cl.
CPC ............... *H01L 24/14* (2013.01); *H01L 24/16* (2013.01); *H01L 24/27* (2013.01); *H01L 24/29* (2013.01); *H01L 24/32* (2013.01); *H01L 24/73* (2013.01); *H01L 24/81* (2013.01); *H01L 24/83* (2013.01); *H01L 24/75* (2013.01); *H01L 2224/1134* (2013.01); *H01L 2224/13017* (2013.01); *H01L 2224/13144* (2013.01); *H01L 2224/14135* (2013.01); *H01L 2224/1623* (2013.01); *H01L 2224/16225* (2013.01); *H01L 2224/16227* (2013.01); *H01L 2224/16238* (2013.01); *H01L 2224/27334* (2013.01); *H01L 2224/29007* (2013.01); *H01L 2224/2919* (2013.01); *H01L 2224/32012* (2013.01); *H01L 2224/3224* (2013.01); *H01L 2224/32225* (2013.01); *H01L 2224/73103* (2013.01); *H01L 2224/73204* (2013.01); *H01L 2224/81191* (2013.01); *H01L 2224/81203* (2013.01); *H01L 2224/81444* (2013.01); *H01L 2224/8385* (2013.01); *H01L 2224/83192* (2013.01); *H01L 2224/83194* (2013.01); *H01L 2224/83203* (2013.01); *H01L 2224/83862* (2013.01); *H01L 2224/9211* (2013.01); *H01L 2224/92125* (2013.01); *H01L 2924/014* (2013.01); *H01L 2924/01004* (2013.01); *H01L 2924/01005* (2013.01); *H01L 2924/01006* (2013.01); *H01L 2924/01029* (2013.01); *H01L 2924/01033* (2013.01); *H01L 2924/01078* (2013.01); *H01L 2924/01079* (2013.01); *H01L 2924/07802* (2013.01); *H01L 2924/07811* (2013.01); *H01L 2924/364* (2013.01); *H01L 2924/381* (2013.01)

(56) References Cited

U.S. PATENT DOCUMENTS

| 6,589,802 | B1 | 7/2003 | Asada |
| 6,926,796 | B1 | 8/2005 | Nishida et al. |
| 7,492,045 | B2 | 2/2009 | Okayama et al. |
| 9,368,374 | B2* | 6/2016 | Hamazaki ............. H01L 21/563 |
| 2002/0155638 | A1 | 10/2002 | Uchida |
| 2003/0032263 | A1 | 2/2003 | Nagao et al. |
| 2003/0178132 | A1 | 9/2003 | Shinozaki |
| 2005/0017355 | A1 | 1/2005 | Chou et al. |
| 2005/0155706 | A1 | 7/2005 | Nishida et al. |
| 2005/0205981 | A1 | 9/2005 | Yoshimura et al. |
| 2005/0224974 | A1 | 10/2005 | Nishida et al. |
| 2007/0013067 | A1 | 1/2007 | Nishida et al. |
| 2008/0196245 | A1 | 8/2008 | Nishimura et al. |
| 2009/0146303 | A1 | 6/2009 | Kwon |
| 2009/0230568 | A1 | 9/2009 | Yasuda et al. |

FOREIGN PATENT DOCUMENTS

| EP | 1126517 | A2 | 8/2001 |
| EP | 1189308 | A1 | 3/2002 |
| JP | 10-242208 | A | 9/1998 |
| JP | 11-233560 | A | 8/1999 |
| JP | 2000-286297 | A | 10/2000 |
| JP | 2002-184811 | A | 6/2002 |
| JP | 2003-142522 | A | 5/2003 |
| JP | 2004-356150 | A | 12/2004 |
| JP | 2005-264109 | A | 9/2005 |
| JP | 2006-265411 | A | 10/2006 |
| JP | 2007-009022 | A | 1/2007 |
| JP | 2008-203484 | A | 9/2008 |
| JP | 2008-258318 | A | 10/2008 |
| JP | 2009-032845 | A | 2/2009 |

OTHER PUBLICATIONS

Sep. 13, 2011, International Preliminary Report on Patentability issued in Application No. PCT/JP2010/052772 (with English Translation).

Jan. 11, 2012, Japanese Office Action issued in Application No. 2010-037838 (with English Translation).

Dec. 31, 2012, First Office Action issued in Chinese Patent Application No. 201080009458.3 (with English Translation).

Sep. 10, 2013, Second Office Action issued in Chinese Patent Application No. 201080009458.3 (with English Translation).

Pascarella N.W. et al., "Compression Flow Modeling of Underfill Encapsulants for Low Cost Flip Chip Assembly", Proceedings of the 48th Electronic Components and Technology Conference, May 25, 1998, pp. 463-470.

Jan. 7, 2014, Supplementary European Search Report issued in European Patent Application No. 10 74 6205.

Mar. 18, 2014, Decision of Rejection issued in Chinese Patent Application No. 201080009458.3 (with English Translation).

May 5, 2014, Office Action issued in Taiwanese Patent Application No. 099105578 (with English Translation).

\* cited by examiner

Prior Art

SEMICONDUCTOR DEVICE HAVING SEMICONDUCTOR CHIP AFFIXED TO SUBSTRATE VIA INSULATING RESIN ADHESIVE FILM

CROSS-REFERENCE TO RELATED APPLICATION

This application is a divisional application of U.S. application Ser. No. 13/131,427 filed May 26, 2011, which is a National Stage of International Application No. PCT/JP2010/052772 filed Feb. 23, 2010, which claims priority based on Japanese Patent Application No. 2009-045164 filed Feb. 27, 2009. The disclosures of the prior applications are hereby incorporated by reference herein in their entirety.

TECHNICAL FIELD

The present disclosure relates to a semiconductor device, particularly a semiconductor device that is obtained by placing a semiconductor chip provided with a plurality of bumps arranged in a peripheral alignment by flip-chip mounting on a substrate via an insulating resin adhesive film.

BACKGROUND

An anisotropic conductive adhesive film (ACF) containing conductive particles has widely been used to place a semiconductor chip by flip-chip mounting on a substrate to manufacture a semiconductor device. However, a trend toward finer interconnection pitch makes it difficult to maintain the connection reliability as a result of relationship between the size of conductive particles and the interconnection pitch.

In response, a conventionally employed process is such that a gold stud bump that can be shaped finely is provided on a semiconductor chip, and the semiconductor chip is placed by flip-chip mounting on a substrate via an insulating resin adhesive film (Patent Literature 1). This flip-chip mounting via an insulating resin adhesive film generally includes the following. First, an insulating resin adhesive film of an area slightly greater than an area substantially the same as the area of a semiconductor chip is temporarily affixed to a substrate. Next, the semiconductor chip and the interconnection substrate are aligned with each other. Then, hot pressing is performed against the semiconductor chip, thereby mounting the semiconductor chip.

CITATION LIST

Patent Literature

Patent Literature 1: Japanese Patent Application Laid-Open No. 2008-203484

SUMMARY

However, the flip-chip mounting disclosed in Patent Literature 1 makes a melted insulating resin adhesive film (NFC) 102 flow over the outer edge of a semiconductor chip 101 provided with bumps 100, thereby causing the overflowing resin to be attached to a hot press bonder 103 as shown in FIG. 5. This results in application of excessive pressure during hot pressing, failing to obtain a semiconductor device attaining an intended quality. Further, failing to remove an insulating resin or an inorganic filler completely from between electrodes 105 of a substrate 104 and the bumps 100 of the semiconductor chip 101 after the hot pressing results in unsatisfactory metallic bonding between the electrodes 105 and the bumps 100. Accordingly, the level of connection reliability is severely reduced. Still further, the insulating resin adhesive film 102 exposed to the outside after moisture absorption and reflow causes curing failure or lifting-off of the semiconductor chip 101. This also reduces the level of connection reliability.

The present disclosure has been made to overcome the foregoing problems in association with the background art. It is, therefore, an object of the disclosure to provide a manufacturing method in which overflow of a melted insulating resin adhesive film, and the intervention of an insulating resin or an inorganic filler between a bump and an electrode during hot pressing can be prevented, thereby providing a semiconductor device having a sufficient moisture absorbed reflow resistance.

The present inventors found that the above-described object is achieved by setting the area of an insulating resin adhesive film with respect to the area of a region enclosed with a plurality of bumps of a semiconductor chip arranged in a peripheral alignment, and the minimum melt viscosity of the insulating resin adhesive film to fall within their respective specific ranges. Thus, the inventors attained the disclosure.

More specifically, the present disclosure provides a method of manufacturing a semiconductor device, includes placing a semiconductor chip provided with a plurality of bumps arranged in a peripheral alignment by flip-chip mounting on a substrate provided with a plurality of electrodes corresponding to the bumps via an insulating resin adhesive film.

The method is characterized by temporarily affixing an insulating resin adhesive film of a size that is substantially 60 to 100% an area of a region enclosed with the plurality of bumps of the semiconductor chip arranged in a peripheral alignment, and having a minimum melt viscosity of $2\times10^2$ to $1\times10^5$ Pa·s, to a region enclosed with the plurality of electrodes of the substrate corresponding to the bumps; aligning the semiconductor chip and the substrate with each other such that the bumps and the electrodes corresponding thereto are opposed to each other; performing hot pressing against the semiconductor chip to establish metallic contact between the bumps and the electrodes; and melting the insulating resin adhesive film to further heat curing the film.

In the method of manufacturing a semiconductor device of the present disclosure, an insulating resin adhesive film of a size that is at least substantially 60 to 100% the area of a region enclosed with the plurality of bumps of a semiconductor chip arranged in a peripheral alignment, and having a minimum melt viscosity of $2\times10^2$ to $1\times10^5$ Pa·s, is temporarily affixed to the region enclosed with the plurality of electrodes of the substrate corresponding to the plurality of bumps of the semiconductor chip. Accordingly, the insulating resin adhesive film is not present between the bumps of the semiconductor chip and the electrode pads of the substrate corresponding thereto immediately after the semiconductor chip is hot pressed against the substrate. Furthermore, the melted insulating resin adhesive film is prevented from flowing over to the outside of the semiconductor chip. Still further, it becomes possible to perform hot pressing at a relatively low pressure. Accordingly, sufficient metallic contact is established between each of the bumps and the corresponding connection pad, while attachment of a melted resin to a hot press bonder is prevented. As already described, junctions between the bumps of the semiconductor chip and the electrodes of the substrate are sealed after hot pressing without causing overflow of a resin, thereby enhancing a resistance to moisture absorption and reflow. As a result, a semiconductor device having high level of connection reliability is provided.

DETAILED DESCRIPTION

A semiconductor device according to the present disclosure will now be described with reference to drawings.

Figure 1A:
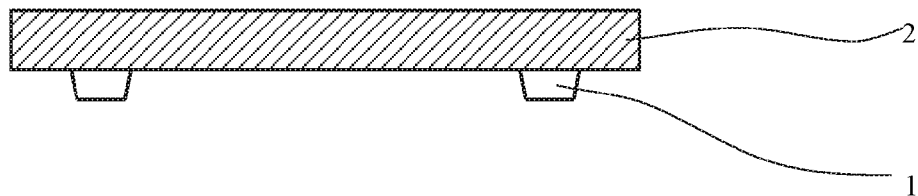
FIG. 1A is a cross-sectional view of a semiconductor chips provided with bumps.
Figure 2:
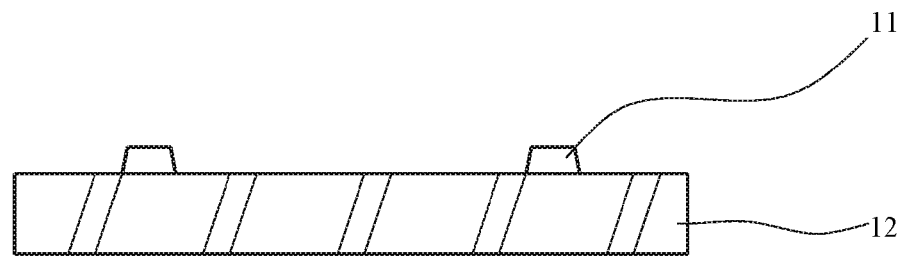
FIG. 2 is a cross-sectional view of a substrate provided with electrodes.

(1) First, a semiconductor chip 2 provided with bumps 1 (FIG. 1A), a substrate 12 provided with electrodes 11 (FIG. 2), and an insulating resin adhesive film (NCF) are prepared.

Figure 1B:
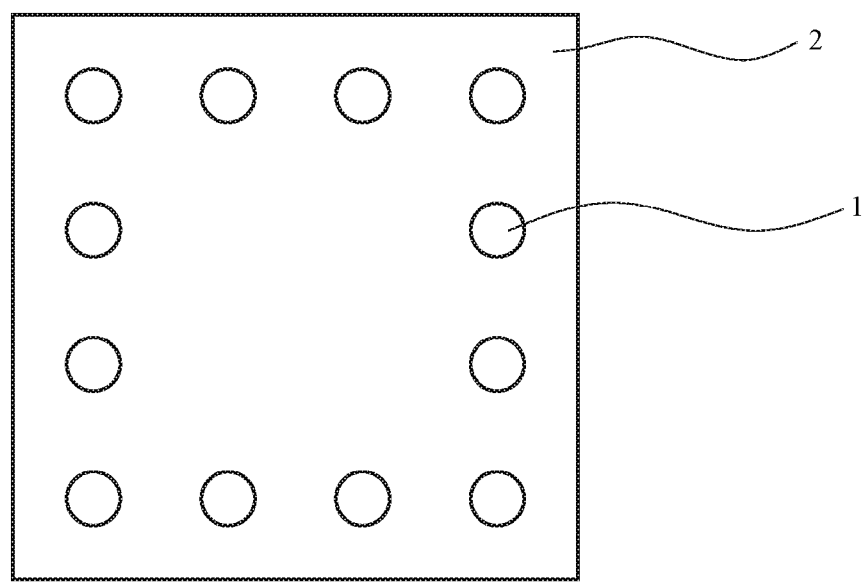
FIG. 1B is a plan view of the semiconductor chip as seen from the bumps.

The bumps 1 are arranged on the semiconductor chip 2 in a peripheral alignment, namely arranged in a line of bumps near the outer periphery of the semiconductor chip 2 (FIG. 1B). While shown to be arranged in a line of bumps in FIG. 1B, the bumps 1 may be arranged in two or more lines of bumps.

There are no particular limitations imposed on the semiconductor chip 2 and the bumps 1. However, gold stud bumps that are highly responsive to a trend toward finer pitch are preferably used as the bumps 1. Regarding the dimension of such gold stud bumps, the height is preferably 35 to 100 μm, more preferably, 35 to 70 μm, and particularly preferably, 35 to 45 μm. The base diameter is preferably 10 to 50 μm, more preferably, 10 to 40 μm, and particularly preferably, 10 to 20 μm. The pitch between the bumps is preferably 50 to 200 μm, and more preferably, 50 to 70 μm.

In order to prevent overflow of a melting insulating resin, a distance between the outer periphery of the semiconductor chip 2 and the bumps 1 is preferably set to 0.07 to 0.2 mm, and more preferably, 0.1 to 0.15 mm.

The electrodes 11 are arranged on the substrate 12 such that they are in positions corresponding to those of the bumps 1 (arranged in a line of bumps) of the semiconductor chip 2 to which the electrodes 11 are to be connected. The insulating resin adhesive film (NCF) is temporarily affixed to a region enclosed with the plurality of electrodes.

There are no particular limitations imposed on the substrate 12 and the electrodes 11. Examples of the substrate 12 include a rigid substrate, a flexible substrate, and a rigid-flexible substrate. Examples of the electrodes 11 include those made by forming copper foil into lands, and applying Ni/Au plating to the surfaces of the lands.

A publicly known insulating resin adhesive film used to mount a semiconductor chip on a substrate is employed as the insulating resin adhesive film (NCF). Examples of the insulating resin adhesive film include those made by forming a curable epoxy resin composition or a curable acrylic resin composition into a film. In preferred examples, these may be of the thermosetting type.

The thermosetting epoxy resin composition can be composed of, for example, a compound or a resin having two or more epoxy groups in a molecule, an epoxy curing agent, a film forming component, and the like.

The compound or resin having two or more epoxy groups in a molecule may either be in a solid state or of a liquid state. Examples of the compound or resin include bifunctional epoxy resins such as bisphenol A epoxy resins and bisphenol F epoxy resins, novolak epoxy resins such as phenol novolak epoxy resins and cresol novolak epoxy resins, and alicyclic epoxy compounds such as 3,4-epoxy-cyclohexenylmethyl-3',4'-epoxycyclohexene carboxylate.

Examples of the epoxy curing agent include amine curing agents, imidazol curing agents, acid anhydride curing agents, and sulfonium cation curing agents. The curing agent may be latent.

Examples of the film forming component include phenoxy resins and acrylic resins compatible with epoxy compounds and epoxy resins.

The thermosetting epoxy resin composition may contain, if necessary, publicly known curing accelerators, silane coupling agents, metal scavengers, stress relieving agents such as butadiene rubbers, inorganic fillers such as silica, polyisocyanate cross-linking agents, colorants, antiseptic agents, solvents, and the like.

The thermosetting acrylic resin composition can be composed of, for example, a (meta)acrylate monomer, a film forming resin, an inorganic filler such as silica, a silane coupling agent, a radical polymerization initiator, and the like.

Examples of the (meta)acrylate monomers include monofunctional (meta)acrylate monomers and polyfunctional (meta)acrylate monomers, or denatured monofunctional or polyfunctional (meta)acrylate monomers formed by introducing an epoxy group, a urethane group, an amino group, an ethylene oxide group, a propylene oxide group or the like to the monofunctional (meta)acrylate monomer or polyfunctional (meta)acrylate monomer. Other monomers such as (meta)acrylic acids, vinyl acetate, styrene and vinyl chloride that can be radically copolymerized with the (meta)acrylate monomers may be used in combination, as long as they do not impair the effect of the present disclosure.

Examples of the film forming resin for the thermosetting acrylic resin composition include phenoxy resins, polyvinyl acetal resins, polyvinyl butyral resins, alkylated cellulose resins, polyester resins, acrylic resins, styrene resins, urethane resins, and polyethylene terephthalate resins.

Examples of the radical polymerization initiator include organic peroxides such as benzoyl peroxides, dicumyl peroxides and dibutyl peroxides, and azobis compounds such as azobisisobutyronitrile and azobis-valeronitrile.

The thermosetting acrylic resin composition may contain, if necessary, stress relieving agents such as butadiene rubbers, solvents such as ethyl acetate, colorants, antiseptic agents, and age resisters.

The thermosetting epoxy resin composition or the thermosetting acrylic resin composition can be shaped into the insulating resin adhesive film (NCF) by employing a publicly known process.

The insulating resin adhesive film (NCF) described so far used in the present disclosure should have a minimum melt viscosity that is preferably set to $2 \times 10^2$ to $1 \times 10^5$ Pa·s, more preferably, $5 \times 10^2$ to $5 \times 10^4$ Pa·s. When the viscosity thereof falls below these ranges, the probability of the resin overflow increases. When the viscosity exceeds these ranges, the probability of failing to seal junctions between bumps and electrodes increases.

The too small a thickness of the insulating resin adhesive film (NCF) results in reduction in its headleability, and the insulating resin adhesive film with such small thickness becomes unable to function as an underfill. In contrast, the too great a thickness of the insulating resin adhesive film generates the overflow during hot pressing. Accordingly, the thickness of the insulating resin adhesive film is preferably 30 to 70 μm, more preferably, 35 to 50 μm.

Figure 3A:
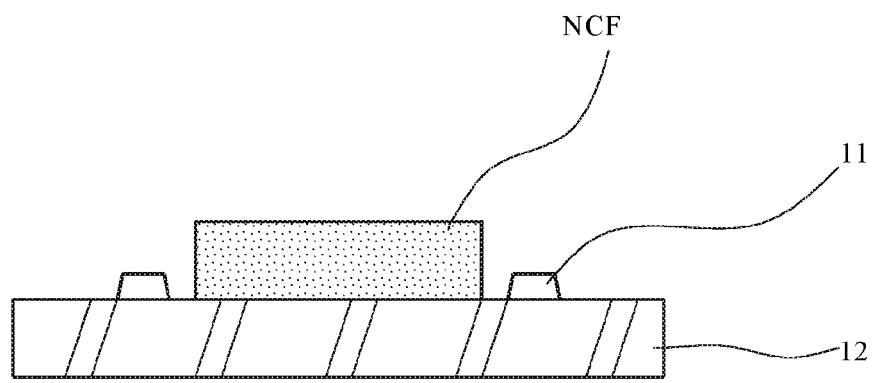
FIG. 3A is a cross-sectional view of the substrate to which an insulating resin adhesive film is temporarily affixed.
Figure 3B:
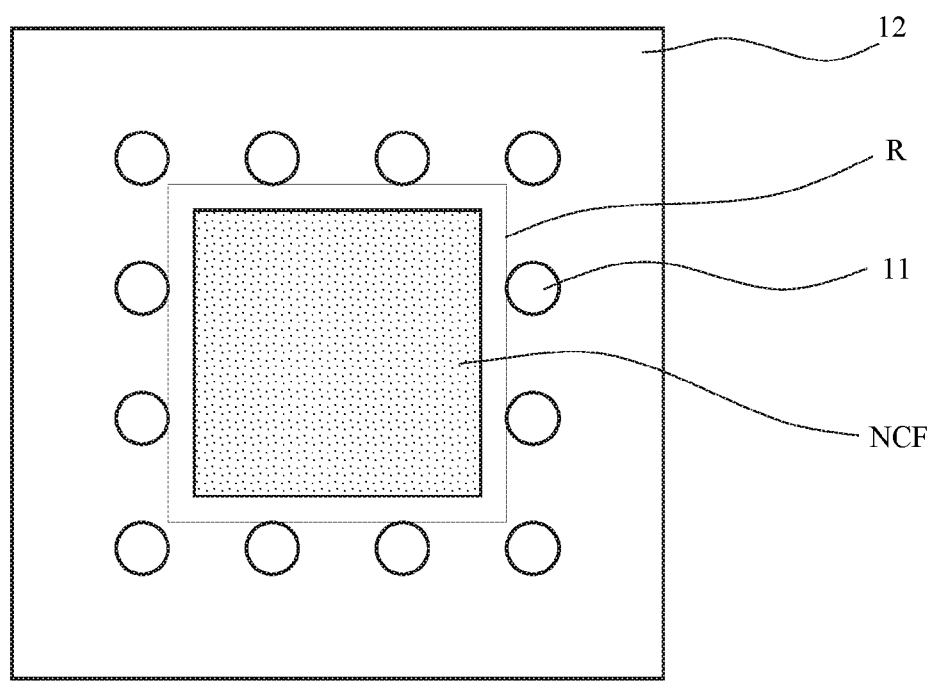
FIG. 3B is a plan view as seen from the insulating resin adhesive film, showing the substrate to which the insulating resin adhesive film is temporarily affixed.

(2) Next, the insulating resin adhesive film (NCF) having a minimum melt viscosity of $2 \times 10^2$ to $1 \times 10^5$ Pas is temporarily affixed to the substrate 12 (FIG. 3A). The position for temporary affixation corresponds to a position inside a region R enclosed with the plurality of bumps 1 of the semiconductor chip 2 arranged in a peripheral alignment (FIG. 3B).

The insulating resin adhesive film (NCF) is of a size equal to 60 to 100%, and more preferably 70 to 90%, the area of the region R enclosed with the bumps 1 of the semiconductor chip 2 arranged in a peripheral alignment. The size less than 60% increases the probability of failing to seal a junction between a bump of a semiconductor chip and an electrode of a substrate. The size greater than 100% results in a fear that an insulating resin or an inorganic filler may not be removed completely between the bump and the electrode, while resulting in failure to alleviate a condition for hot pressing.

The condition for temporary affixation is preferably such that an insulating resin adhesive film will not substantially be cured. More specifically, examples of the condition include temperatures of 60 to 70° C., pressures of 0.25 to 1.0 MPa, and duration of 1 to 3 seconds.

Figure 4A:
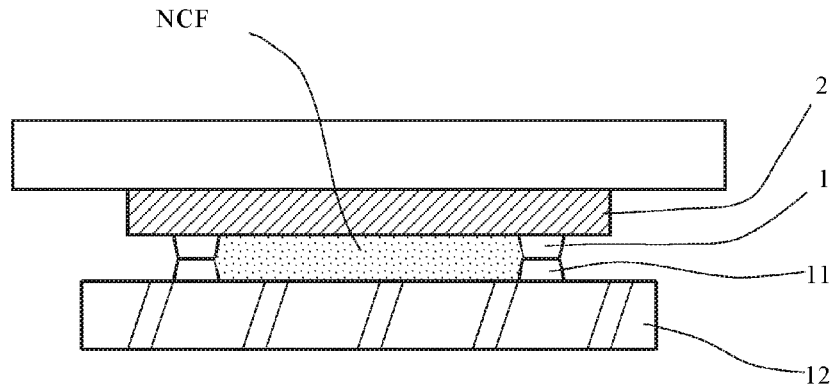
FIG. 4A is a view explaining a state immediately after the semiconductor chip is hot pressed by a hot press bonder against the substrate.
Figure 4B:
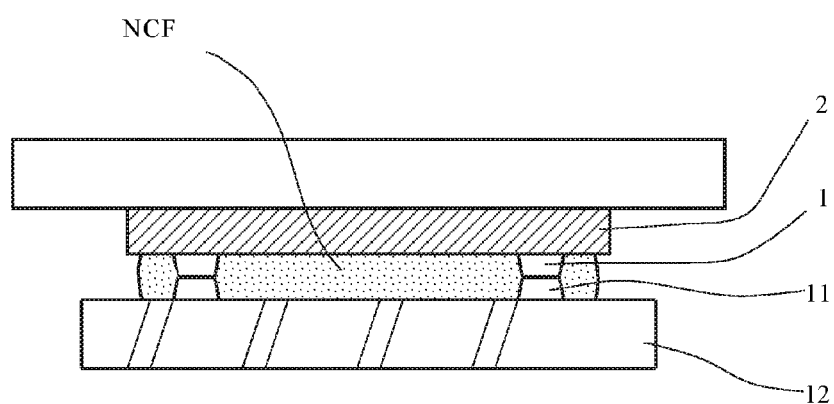
FIG. 4B is a view explaining a state after the semiconductor chip is hot pressed to a significant extent by the hot press bonder against the substrate.
Figure 5:
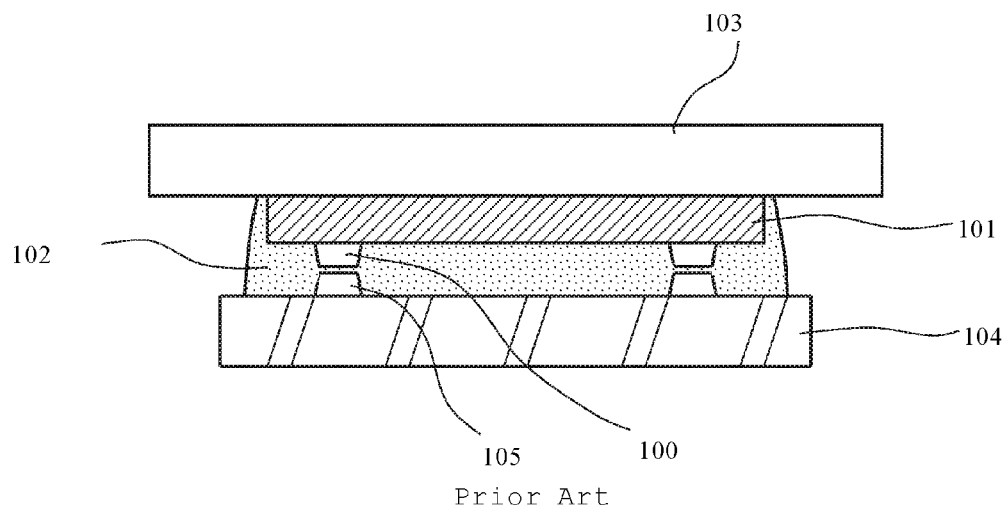
FIG. 5 is a view explaining flip-chip mounting of the background art.

(3) Next, the semiconductor chip 2 and the substrate 12 are aligned with each other such that the bumps 1 and the electrodes 11 corresponding thereto are opposed to each other. Then, hot pressing is performed against the semiconductor chip 2 by a hot press bonder 30 (FIG. 4A). In this case, with regard, first, to the bumps 1 and the electrodes 11, they become in direct contact with each other without holding the insulating resin adhesive film therebetween, thereby establishing metallic contact therebetween. With regard to the insulating resin adhesive film, it is melted, and is then hot cured. As a result, a semiconductor device is completed. During the hot pressing, the melted insulating resin adhesive film spreads toward the outer edge of the semiconductor chip 2, and is then cured. The periphery of the cured insulating resin adhesive film may be defined only in the region enclosed with the plurality of bumps 1 arranged in a peripheral alignment. However, it is preferable that this periphery also be defined between the plurality of bumps 1 arranged in a peripheral alignment and the outer edge of the semiconductor chip 2 as shown in FIG. 4B, as this will seal junctions between the bumps 1 and the electrodes 11.

Hot press bonders conventionally employed in flip-chip mounting may be used as the hot press bonder 30.

Examples of a condition for hot pressing using the hot press bonder 30 include hot press temperatures that are preferably 120 to 270° C., and more preferably 170 to 200° C., and pressures that are preferably 0.5 to 2.5 MPa, and more preferably 2.0 to 2.5 MPa. The configuration of the present disclosure especially advantageously reduces pressures during hot pressing to about one-third to one-fifth the conventional pressure that is 10 kg/IC.

The semiconductor device obtained by following the above-described manufacturing method of the present disclosure has a moisture absorbed reflow resistance, and excellent connection reliability.

EXAMPLES

Examples are given below to more specifically describe the present disclosure. In Examples given below, minimum melt viscosities of NCF compositions were measured by using a cone-plate viscometer.

Examples of Manufactures 1 to 5 of Insulating Resin Adhesive Film (NCF)

Ingredients shown in Table 1 were uniformly mixed, and toluene was added to resultant mixtures such that the solid content concentrations thereof are 60% by mass. As a result, NCF compositions were obtained. The resultant compositions were applied by using a bar coater onto release films (manufactured by Sony Chemical & Information Device Corporation), and were dried in an oven at a temperature of 80° C. As a result, insulating resin adhesive films (NCFs) 1 to 5 with a thickness of 50 μm were obtained. The minimum melt viscosities (Pa·s) of the NCFs thereby obtained were measured at a rate of temperature increase of 10° C./min by using the cone-plate viscometer. The measured result is shown in Table 1. Insulating resin adhesive films applicable to the present disclosure are the NCFs 2 to 4 in terms of minimum melt viscosity.

TABLE 1

| Ingredient (part by mass) | Product Name | NCF 1 | NCF 2 | NCF 3 | NCF 4 | NCF 5 |
|---|---|---|---|---|---|---|
| Film-forming component | YP50 *1 | — | — | — | 15 | 15 |
| Solid epoxy | YD020 *2 | 30 | 15 | 15 | — | — |
| Liquid epoxy | JER828 *3 | 10 | 10 | 10 | 10 | 10 |
| Rubber component | XER-91 *4 | 5 | 5 | 5 | 5 | 5 |
| Curing agent | 3941HP *5 | 5 | 20 | 20 | 20 | 20 |
| Silica particle | SO-E2 *6 | — | 50 | 46 | 46 | 42 |
|  | RY200 *7 | — | — | 4 | 4 | 8 |
| Silane coupling agent | A-187 *8 | 1 phr | 1 phr | 1 phr | 1 phr | 1 phr |
| Minimum melt viscosity [Pa · s] |  | $1 \times 10^1$ | $2 \times 10^2$ | $8 \times 10^3$ | $1 \times 10^5$ | $4 \times 10^7$ |

Notes
*1: Phenoxy resin, manufactured by Tohto Kasei Co., Ltd.
*2: manufactured by Tohto Kasei Co., Ltd.
*3: manufactured by Japan Epoxy Resins Co., Ltd.
*4: Acrylonitol-butadiene rubber particles, manufactured by Japan Synthetic Rubber Co., Ltd.
*5: Imidazol latent curing agent, manufactured by Asahi Kasei Chemicals Corporation
*6: manufactured by Shin-Etsu Quartz Products Co., Ltd.
*7: manufactured by NIPPON AEROSIL CO., LTD.
*8: manufactured by Momentive Performance Materials Inc.

Examples 1 to 7 and Comparative Examples 1 to 6

The NCFs 1 to 5 cut into NCF area ratios shown in Table 2 were temporarily affixed (at a temperature of 60° C., a pressure of 0.5 MPa, and with a duration of heating and pressurization of 3 seconds) by a hot press bonder (available from Sony Chemical & Information Device Corporation) to a region enclosed with electrodes (formed by applying nickel-gold plating to copper) of a substrate (MCL-E-679F, available from Hitachi Chemical Co., Ltd.). The electrodes of the substrate correspond to a plurality of Au stud bumps (with a height of 75 to 85 μm) arranged in a peripheral alignment (in a pitch of 150 μm) provided to an LSI chip (6.3 mm per side and with a thickness of 0.1 mm; an average distance between the bumps and the periphery of the LSI chip is 0.1 μm). The NCF area ratio is a ratio of the area of a cut-out NCF to the area of the region enclosed with the plurality of bumps.

(Presence or Absence of Resin Attached to Bonder)

The surface of the LSI chip provided with the bumps was placed to be opposed to the surface of the substrate to which the NCF was temporarily affixed. Then, after alignment, hot pressing was performed (permanent thermocompression bonding; at a temperature of 180° C., a pressure of 2.5 MPa, and with a duration of heating and pressurization of 20 seconds) by using a hot press bonder that is 8 mm per side (available from Sony Chemical & Information Device Corporation). As a result, a semiconductor device was obtained. Regarding the semiconductor device thereby obtained, the presence or absence of a resin attached to the hot press bonder was visually examined. The result of examination is shown in Table 2.

(Moisture Absorbed Reflow Resistance)

The semiconductor devices were left to stand at a temperature of 85° C. and a humidity of 85% for 168 hours, and thereafter, was immersed in a solder reflow furnace the maximum temperature of which is 265° C. Thereafter, a conductive resistance value was measured. A conductive resistance value of less than $0.13\Omega$ was rated as A. A conductive resistance value of not less than $0.13\Omega$ and not greater than $1.0\Omega$ was rated as B. A conductive resistance value of greater than $1\Omega$ was rated as C. The result thereby obtained is shown in Table 2.

(Initial Conductive Resistance and Conductive Resistance After PCT)

An initial conduction resistance and a conduction resistance after PCT test (standing at a temperature of 121° C. and a humidity of 100% for 120 hours) were also measured. The measured result (a maximum value among a plurality of measured results) is shown in Table 2. A conductive resistance of not less than $1\Omega$ was rated as "open." A conductive resistance is desirably not greater than $0.3\Omega$ from a practical viewpoint.

As seen from Table 2, the semiconductor substrates of Examples 1 to 7 each having an NCF area ratio corresponding to a size of 60 to 100%, and a minimum melt viscosity of $2\times10^2$ to $1\times10$-Pa·s, prevented overflow of a melting insulating resin during hot pressing, and realized high level of connection reliability as a result of their low conductive resistances both in an initial stage and in a stage after the PCT test. In particular, it was found that Examples 1 to 3 each resulted in little difference between a conductive resistance after the PCT test and an initial conductive resistance, and thus has an excellent moisture absorbed reflow resistance.

In contrast, attachment of a resin to a bonder was observed in the case of each of Comparative Examples 1 and 5 due to too low an NCF minimum melt viscosity, and in the case of Comparative Example 4 due to too high an NCF area ratio. In each of these cases, the moisture absorbed reflow resistance was rated as "C," and the conductive resistance after the PCT was rated as "open." In addition to these ratings, the initial conductive resistance was rated as "open" in the case of Comparative Example 4. In the case of each of Comparative Examples 2 and 6, the moisture absorbed reflow resistance was rated as "C," and the conductive resistance after the PCT was rated as "open" due to too high an NCF minimum melt viscosity. In the case of Comparative Example 3, the moisture absorbed reflow resistance was rated as "C," and the conductive resistances both in the initial stage and in the stage after the PCT were rated as "open" due to too low an NCF area ratio.

(Evaluation of Low-Pressure Bonding Properties)

Measurement was repeatedly conducted under the same condition as that defined for each of Examples 1 and 2, with the exception that a pressure during hot pressing was set to 0.5 MPa. As a result, no attachment of a resin to the bonder was observed, and a conductive resistance after the PCT test did not change. Accordingly, it was found that the manufacturing method of the present disclosure is suitable for low-pressure bonding.

The method of manufacturing a semiconductor device according to the present disclosure prevents overflow of an NCF, and prevents the intervention of an insulating resin or an inorganic filler between a bump and an electrode pad

TABLE 2

| | Example | | | | | | | Comparative Example | | | | | |
|---|---|---|---|---|---|---|---|---|---|---|---|---|---|
| | 1 | 2 | 3 | 4 | 5 | 6 | 7 | 1 | 2 | 3 | 4 | 5 | 6 |
| NCF No. | NCF 3 | NCF 3 | NCF 3 | NCF 4 | NCF 4 | NCF 2 | NCF 2 | NCF 1 | NCF 5 | NCF 3 | NCF 3 | NCF 1 | NCF 5 |
| NCF area ratio (%) | 70 | 80 | 90 | 70 | 90 | 70 | 90 | 70 | 90 | 50 | 120 | 80 | 80 |
| NCF minimum melt viscosity (Pa·s) | $8\times10^3$ | $8\times10^3$ | $8\times10^3$ | $1\times10^5$ | $1\times10^5$ | $2\times10^2$ | $2\times10^2$ | $1\times10^1$ | $4\times10^7$ | $8\times10^3$ | $8\times10^3$ | $1\times10^1$ | $4\times10^7$ |
| Presence or absence of resin attached to bonder | Absence | Absence | Absence | Absence | Absence | Absence | Absence | Presence | Absence | Absence | Presence | Presence | Absence |
| Moisture absorbed reflow resistance | A | A | A | B | B | B | B | C | C | C | C | C | C |
| Initial conductive resistance (Ω) | 0.107 | 0.109 | 0.104 | 0.105 | 0.109 | 0.108 | 0.11 | 0.107 | 0.191 | open | open | 0.104 | 0.156 |
| Conductive resistance (Ω) after PCT | 0.109 | 0.112 | 0.107 | 0.13 | 0.135 | 0.136 | 0.133 | open | open | open | open | open | open | during hot pressing. Accordingly, a semiconductor device provided by the method has a sufficient resistance to moisture absorption and reflow.

DESCRIPTION OF REFERENCE NUMERALS 1, 100 bump
2, 101 semiconductor chip
11, 105 electrode
12, 104 substrate
30, 103 hot press bonder
NCF, 102 insulating resin adhesive film
R area

The invention claimed is:

1. A semiconductor device comprising:
   a semiconductor chip provided with a plurality of bumps arranged in a peripheral alignment;
   a substrate provided with a plurality of electrodes; and
   an insulating resin adhesive film;
   wherein:
   the semiconductor chip is affixed to the substrate via the insulating resin adhesive film such that the electrodes are in positions corresponding to the positions of the bumps,
   the insulating resin adhesive film has a minimum melt viscosity of $8 \times 10^3$ to $1 \times 10^5$ Pa·s,
   the insulating resin adhesive film covers 70 to 90% the area of the region enclosed with the plurality of bumps of the semiconductor chip arranged in the peripheral alignment,
   the bumps and the electrodes corresponding thereto are arranged so that they are opposed to each other and establish metallic contact therebetween, and
   the insulating resin adhesive film is heat cured, and a periphery thereof is defined between the plurality of bumps arranged in the peripheral alignment and the outer edge of the semiconductor chip, exclusive.

2. The semiconductor device according to claim 1, wherein the insulating resin adhesive film contains a curable epoxy resin composition or a curable acrylic resin composition.

3. The semiconductor device according to claim 2, wherein the insulating resin adhesive film contains a curable acrylic resin composition.

4. The semiconductor device according to claim 1, wherein the plurality of bumps of the semiconductor chip are gold stud bumps of a height of 35 to 100 μm.

5. The semiconductor device according to claim 1, wherein the insulating resin adhesive film has a thickness of 30 to 70 μm.

\* \* \* \* \*